(12) United States Patent
Ku

(10) Patent No.: US 6,920,068 B2
(45) Date of Patent: Jul. 19, 2005

(54) SEMICONDUCTOR MEMORY DEVICE WITH MODIFIED GLOBAL INPUT/OUTPUT SCHEME

(75) Inventor: Kie-Bong Ku, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 29 days.

(21) Appl. No.: 10/749,892

(22) Filed: Dec. 31, 2003

(65) Prior Publication Data

US 2004/0240274 A1 Dec. 2, 2004

(30) Foreign Application Priority Data

May 30, 2003 (KR) .................................. 10-2003-0034876

(51) Int. Cl.[7] ................................................ G11C 11/34
(52) U.S. Cl. ................................. 365/189.02; 365/233
(58) Field of Search .............................. 365/189.02, 233

(56) References Cited

U.S. PATENT DOCUMENTS

| | | | |
|---|---|---|---|
| 5,592,434 A | 1/1997 | Iwamoto et al. | |
| 5,594,704 A | 1/1997 | Konishi et al. | |
| 5,831,924 A | 11/1998 | Nitta et al. | |
| 5,867,446 A | 2/1999 | Konishi et al. | |
| 5,956,285 A | 9/1999 | Watanabe et al. | |
| 6,065,092 A | * 5/2000 | Roy | ............................ 711/5 |
| 6,091,659 A | 7/2000 | Watanabe et al. | |
| 6,327,214 B1 | 12/2001 | Yoon et al. | |
| 6,378,102 B1 | 4/2002 | Watanabe et al. | |
| 6,449,198 B1 | 9/2002 | Hamade et al. | |
| 6,859,414 B2 | * 2/2005 | Koo | ............................ 365/233 |

FOREIGN PATENT DOCUMENTS

| | | |
|---|---|---|
| JP | 08-077771 | 3/1996 |
| JP | 08-221981 | 8/1996 |
| JP | 09-288888 | 11/1997 |
| JP | 11-317091 | 11/1999 |
| JP | 2000-076858 | 3/2000 |
| JP | 2000-090670 | 3/2000 |
| JP | 2001-035154 | 2/2001 |
| JP | 2001-126470 | 5/2001 |
| JP | 2001-155485 | 6/2001 |
| JP | 2002-245792 | 8/2002 |

* cited by examiner

*Primary Examiner*—M. Tran
(74) *Attorney, Agent, or Firm*—Blakely Sokoloff Taylor & Zafman

(57) ABSTRACT

A semiconductor memory device including a main amplifier for amplifying an output from a bit line sensing amplifier and outputting the amplified output to a first data line; an input/output multiplexer connected to the first data line; a repeater connected to the first data line; an input/output write unit for receiving a data to be written and outputting the data to a second data line; and a write driver connected to the second data line for transferring the data on the second data line to the bit line sensing amplifier.

9 Claims, 6 Drawing Sheets

SEMICONDUCTOR MEMORY DEVICE WITH MODIFIED GLOBAL INPUT/OUTPUT SCHEME

FIELD OF INVENTION

The present invention relates to a semiconductor memory device; and, more particularly, to a semiconductor memory device with modified global input/output scheme.

DESCRIPTION OF PRIOR ART

In a conventional semiconductor memory device, a global input/output (GIO) line is shared during both of a read operation and a write operation.

FIG. 1 is a block diagram showing a read/write control circuit included in the conventional semiconductor memory device.

As shown, the read/write control circuit includes a bit line sensing amplifier BLSA 100, a main amplifier MAIN AMP 101, an input-output multiplexer I/O MUX 103, an input-output write unit $WT_{13}IO$ 104, a write driver $WT_{13}DRV$ 102 and a repeater 105.

Referring to FIG. 1, a read operation of the conventional semiconductor memory device is described below.

Data stored in a memory cell is outputted from the bit line sensing amplifier BLSA 100, and the outputted data is loaded on a GIO line by the main amplifier MAIN AMP 101.

Herein, the GIO line included in the conventional semiconductor memory device is generally very long, sometimes longer than 8000 $\mu$m. Therefore, the main amplifier MAIN AMP 101 is needed to operate the GIO line. However, an electrical load on the GIO line is so high that a speed of a signal on the GIO line is slowed. Therefore, the repeater 105 is connected to the GIO line.

Thereafter, the data loaded on the GIO line is inputted to an input-output multiplexer I/O MUX 103, and is outputted through a data output buffer (not shown). Herein, the input-output multiplexer I/O MUX 103 is for selecting a data mode from x4, x8, and x16 depending on a data width; and also for a parallel test mode.

The write operation is described below referring to FIG. 1.

Data to be stored in a memory cell is inputted to the input-output write unit WT_IO 104 through an input driver (not shown). The input-output write unit WT_IO 104 amplifies the inputted data and outputs to the GIO line. Then, the data loaded on the GIO line is stored on the memory cell through the write driver WT_DRV 102 and the bit line sensing amplifier BLSA 100.

As described above, in the conventional semiconductor memory device, the GIO line is shared in the write operation and the read operation, and the repeater 105 is included in the GIO line. However, if the repeater 105 is sensitive to a noise, the repeater 105 can make an error of inverting the data loaded on the GIO line.

FIG. 2 is a circuit diagram showing the input-output write unit WT_IO 104 shown in FIG. 1.

As shown, the input-output write unit WT_IO 104 includes a first to fifth PMOS transistors 205 to 209, a sixth PMOS transistor 213, a first to fifth NMOS transistors 200 to 204, a sixth NMOS transistor 214, a first to third inverters 210 to 212 and a latch 215.

The first PMOS transistor 205 is connected between a power supply voltage and a first node A, and its gate receives a data input strobe signal DINST. The second PMOS transistor 206 is connected between the power supply voltage and the first node A, and its gate is connected to a second node B. The fourth PMOS transistor 208 is connected between the power supply voltage and the second node B, and its gate is connected to the first node A.

The fifth PMOS transistor 209 is connected between the power supply voltage and the second node B, and its gate receives the data input strobe signal DINST. The third PMOS transistor 207 is connected between the first node A and the second node B, and its gate receives the data input strobe signal DINST.

The drain of the fourth NMOS transistor 203 is connected to the first node A and the gate of the same transistor is connected to the second node B. The second NMOS transistor 201 is connected between the source of the fourth NMOS transistor 203 and a third node C, and its gate receives a main data input signal DIN. The drain of the fifth NMOS transistor 204 is connected to the second node B, and the gate of the same transistor is connected to the first node A.

The third NMOS transistor 202 is connected between the source of the fifth NMOS transistor 204 and the third node C, and its gate is connected to a sub data input signal DINB. The first NMOS transistor 200 is connected between the third node C and a ground, and its gate receives the data input strobe signal DINST.

The first inverter 210 is for inverting a signal outputted from the second node B, and the second inverter 211 inverts the signal once again. The third inverter 212 inverts a signal outputted from the first node A.

The sixth PMOS transistor 213 is connected between the power supply voltage and a fourth node D, and receives a signal from the second inverter 211. The sixth NMOS transistor 214 is connected between the fourth node D and the ground, and its gate receives a signal from the third inverter 214. The latch 215 is for outputting a signal outputted from the fourth node D.

The input-output write unit WT_IO 104 operates depending on the data input strobe signal DINST, and this operation is described below.

If the data input strobe signal DINST is inactivated as a logic 'LOW' level, the first NMOS transistor 200 is turned off, the first and fifth PMOS transistors 205 and 209 are turned on, whereby the nodes A and B become in a logic 'HIGH' level.

Therefore, input signals for the first inverter 210 and the third inverter 212 are in a logic 'HIGH' level. Subsequently, the sixth PMOS transistor 213 and the sixth NMOS transistor 214 are turned off, and the input-output write unit WT_IO 104 is disabled. Therefore, no data is loaded on the GIO line.

On the other hand, if the data input strobe signal DINST is activated and the main and sub data input signals DIN and DINB are inputted, a voltage level of the first node A starts to be reduced because the second NMOS transistor 201 is turned on. Herein, the main data input signal DIN is in a logic 'HIGH' level and the sub data input signal DINB is in a logic 'LOW' level.

However, a voltage level of the second node B is not reduced staying in a logic 'HIGH' level because the gate of the third NMOS transistor 202 receives the sub data input signal DINB which is in a logic 'LOW' level. Moreover, as the voltage of the first node A reduces, the fourth PMOS transistor 208 is turned-on and the fifth NMOS transistor 204 is turned-off, whereby the voltage level of the second node B is increased.

Therefore, as the voltage level of the second node B is increased, the fourth NMOS transistor 203 is more rapidly turned-on and the second PMOS transistor 206 is more rapidly turned-off, whereby the voltage of the first node A is reduced more rapidly.

Subsequently, the first node A becomes in a logic 'LOW' level and the output of the third inverter 212 becomes in a logic 'HIGH' level, whereby the sixth NMOS transistor 214 is turned-off. Therefore, the sixth PMOS transistor 213 is turned-off because the second node B is in a logic 'HIGH' level and the output of the second inverter is in a logic 'HIGH' level. Therefore, the output of the GIO line is in a logic 'LOW' level. This means that the logic 'LOW' level data on the sub data input signal DINB is outputted as a logic 'LOW' level data through the GIO line.

On the other hand, if the main data input signal DIN becomes in a logic 'LOW' level and the sub data input signal DINB becomes in a logic 'HIGH' level, the output of the GIO line becomes in a logic 'HIGH' level. Herein, the data input strobe signal DINST is still activated.

However, the input-output write unit WT_IO 104 has a problem that it consumes much power and it should be symmetrically lay outted.

FIG. 3 is a circuit diagram showing the input-output multiplexer I/O MUX 103. This multiplexer is for the x8 mode.

As shown, the input-output multiplexer I/O MUX 103 includes a fourth inverter 300, a fifth to seventh inverters 303 to 305, a first and second NAND gates 301 and 302, a third and fourth NAND gates 306 to 307, a first and second transferring gates 308 and 309, and a second latch 310.

The fourth inverter 300 receives an address signal Y11 to output the Y11 after inverting the Y11. The first NAND gate 301 receives a data-width signal X8 and an output from the fourth inverter 300. The second NAND gate 302 receives the data-width signal X8 and the address signal Y11.

The sixth inverter 304 inverts an output from the second NAND gate 302. The seventh inverter 305 inverts an output from the first NAND gate 301. The fifth inverter 303 receives a write signal WT to invert the write signal WT.

The third NAND gate 306 receives an output from the fifth inverter 303 and an output from the sixth inverter 304. The fourth NAND gate 307 receives the output from the fifth inverter 303 and an output from the seventh inverter 305.

The first transferring gate 308 controlled by an output from the third NAND gate 306 outputs a first data signal GIO<0> through a multiplexer output terminal MX_OUT. The second transferring gate 309 controlled by an output from the fourth NAND gate 307 outputs a second data signal GIO<1> through the multiplexer output terminal MX_OUT. The second latch 310 is connected to the multiplexer output terminal MX_OUT.

As mentioned above, the input-output multiplexer I/O MUX 103 is for the x8 mode, whereby a partial data division of a total data loaded on the GIO line is outputted through the multiplexer output terminal MX_OUT.

That is, only eight data signals from a total data signal GIO<0:15> are selected to be outputted through the multiplexer output terminal MX_OUT, wherein the notation 'GIO<0:15>' means GIO<0>, GIO<1>, . . . , and GIO<15>. Each of the eight data signals is selected from a first data signal pair GIO<0:1>, a second data signal pair GIO<2:3>, . . . , and an eighth data signal pair GIO<14:15>.

The address signal Y11 is used to select one data signal from the each of the first to eighth data signal pairs, e.g., to select one data signal from the first data signal pair GIO<0:1>.

If the input-output multiplexer I/O MUX 103 is not in the x8 mode, the multiplexer output terminal MX_OUT holds a data stored in the second latch 310, and it also holds the data stored in the second latch 310 during the write operation.

The write signal WT is activated as a logic 'HIGH' level in the write operation, and it is inactivated as a logic 'LOW' level in the read operation. The data-width signal X8 is activated as a logic 'HIGH' level in the x8 mode, and it is inactivated as a logic 'LOW' level if the input-output multiplexer I/O MUX 103 is not in the x8 mode.

As described above, the input-output multiplexer I/O MUX 103 outputs one of the first data signal pair GIO<0:1> in response to the address signal Y11 in the read operation. That is, if the address signal Y11 is in a logic 'HIGH' level, GIO<0> is selected; however, if the address signal Y11 is in a logical 'LOW' level, GIO<1>is selected. This is the same for the other data signal pairs, i.e., GIO<2:3>, GIO<4:5>, . . . , and GIO<14:15>.

If the write signal WT is activated, the input-output multiplexer I/O MUX 103 is disabled as described above because the input-output multiplexer I/O MUX 103 is operated in the read operation. That is, as the write signal WT is activated, outputs from the third and fourth NAND gates 306 and 307 are in a logic 'HIGH' level, whereby the first and second transferring gates 308 and 309 are turned-off, and the multiplexer output terminal MX_OUT holds the data stored in the second latch 310.

Likewise, if the input-output multiplexer I/O MUX 103 is not in the x8 mode, the data-width signal X8 is inactivated as a logic 'LOW' level, whereby outputs from the first and second NAND gates 301 and 302 become in a logic 'HIGH' level. Subsequently, the first and second transferring gates 308 and 309 are turned-off, and the multiplexer output terminal MX_OUT holds the data stored in the second latch 310.

Hereinafter, the read operation and the write operation of the conventional semiconductor memory device are described referring FIGS. 1 to 3.

If the conventional semiconductor memory device reads a logic 'HIGH' data stored in a memory cell at $(N-1)^{th}$ clock, the logic 'HIGH' data stored in the memory cell is outputted through the bit line sensing amplifier BLSA 100, the main amplifier MAIN AMP 101, the GIO line and the input-output multiplexer I/O MUX 103. Herein, the 'N' means a natural number larger than one.

Since the conventional semiconductor memory device is in the read operation, the first and second transferring gates 308 and 309 are turned-on, whereby the logic 'HIGH' data loaded on the GIO line is outputted from the input-output multiplexer I/O MUX 103, and also the data stored in the second latch 310 becomes in a logic 'HIGH' level.

Thereafter, if the conventional semiconductor memory device writes a logic 'LOW' data on the memory cell at $N^{th}$ clock, the logic 'LOW' data is passed through the input-output write unit WT_IO 104, the GIO line, the writ drive WT_DRV 102 and the bit line sensing amplifier BLSA 100 to be stored on the memory cell.

Since the conventional semiconductor memory device is in the write operation, the write signal WT is activated, whereby the first and second transferring gates 308 and 309 are turned-off. Subsequently, the data stored in the second latch 310 is not changed, i.e., the second latch still holds the data stored at $(N-1)^{th}$ clock.

Thereafter, if the conventional semiconductor memory device reads a logic 'LOW' data stored in the memory cell at $(N+1)^{th}$ clock, the logic 'LOW' data stored in the memory cell is passed through the bit line sensing amplifier BLSA 100, the main amplifier MAIN AMP 101, the GIO line and the input-output multiplexer I/O MUX 103 to be outputted.

Since the conventional semiconductor memory device is in the read operation, the first and second transferring gates 308 and 309 are turned-on, whereby the logic 'LOW' data loaded on the GIO line is outputted from the input-output multiplexer I/O MUX 103, and also the data stored in the second latch 310 becomes in a logic 'LOW' level.

Herein, the data stored in the second latch 310 is changed from a logic 'HIGH' level to a logic 'LOW' level. Since the GIO line is supplied with power by the main amplifier MAIN AMP 101, the data loaded on the GIO line has an enough power to change a logical level of the data stored in the second latch 310.

That is, although there is a charge sharing between the GIO line and the second latch 310 during the read operation, the GIO line supplied power by the main amplifier MAIN AMP 101 can change the logic level of the data stored in the second latch 310.

However, there occurs a problem if the repeater 105 is connected to the GIO line in order to increase a data transferring speed of the GIO line. The repeater 105 controls a logic threshold voltage to increase a transition speed of a signal.

FIG. 4 is a circuit diagram showing the repeater 105 included in the conventional semiconductor memory device.

As shown, the repeater 105 includes a third latch 400, an eighth and ninth inverters 401 and 402, a seventh and eighth PMOS transistors 403 and 405, a seventh and eighth NMOS transistors 404 and 406, and a variable delay unit 407.

The third latch 400 is connected to the GIO line. The eighth and ninth inverters 401 and 402 are connected to the GIO line to invert a signal on the GIO line. The eighth PMOS transistor 405 is connected between the power supply voltage and the seventh PMOS transistor 403. The seventh PMOS transistor 403 is connected between the drain of the eighth PMOS transistor 405 and the GIO line, and its gate receives an output from the eighth inverter 401.

The eighth NMOS transistor 406 is connected between the ground and the seventh NMOS transistor 404. The seventh NMOS transistor 404 is connected between the GIO line and the drain of the eighth NMOS transistor 406, and its gate receives an output from the ninth inverter 402.

The variable delay unit 407 delays the total data signal GIO<0:15> and outputs the delayed signal to the eighth PMOS transistor 405 and the eighth NMOS transistor 406.

The eighth inverter 401 is provided with a CMOS inverter formed by a PMOS transistor and an NMOS transistor. A size ratio of the PMOS transistor to the NMOS transistor is about 1.8:30. This ratio makes the eighth inverter 401 can invert a signal rapidly from a logic 'HIGH' level to a logic 'LOW' level.

Likewise, the ninth inverter 402 is provided with a CMOS inverter formed by a PMOS transistor and an NMOS transistor. A size ratio of the PMOS transistor to the NMOS transistor is about 12:1.8. This ratio makes the ninth inverter 402 can invert a signal rapidly from a logic 'LOW' level to a logic 'HIGH' level.

Referring to characteristics of the repeater 105 mentioned above, an operation of the repeater 105 is described below.

In case that a signal loaded on the GIO line is transited from a logic 'LOW' level to a logic 'HIGH' level, the repeater 105 is operated as follows.

Because, at first, the signal loaded on the GIO line is in a logic 'LOW' level, the output from the eighth inverter 401 is in a logic 'HIGH' level, whereby the seventh PMOS transistor 403 is turned-off. Likewise, the output from the ninth inverter 402 is also in a logic 'HIGH' level, whereby the seventh NMOS transistor 404 is turned-on. The eighth PMOS transistor 405 and the eighth NMOS transistor 406 are turned-off.

Even though the eighth PMOS transistor 405 and the seventh NMOS transistor 404 are turned-on, the signal loaded on the GIO line stays in a logic 'LOW' level because the seventh PMOS transistor 403 and the eighth NMOS transistor 406 are turned-off.

Thereafter, if the signal loaded on the GIO line becomes in a logic 'HIGH' level, the seventh PMOS transistor 403 is turned-on and the seventh NMOS transistor 404 is turned-off. At this time, the output from the variable delay unit 407 is still in a logic 'LOW' level because the variable delay unit 407 delays the signal loaded on the GIO line.

Therefore, the eighth PMOS transistor 405 is still turned-on and the eighth NMOS transistor 406 is still turned-off. Subsequently, the eighth PMOS transistor 405 and the seventh PMOS transistor 403 are turned-on, whereby the signal loaded on the GIO line is firmly in a logic 'HIGH'.

However, the repeater 105 is very sensitive to a noise. Therefore, if there occurs a charge sharing between the GIO line loading a logic 'LOW' data and the second latch 310 holding a logic 'HIGH' data, the data loaded on the GIO line is changed to a logic 'HIGH' level regardless of an output from the main amplifier MAIN AMP 101.

That is, although the output from the main amplifier MAIN AMP 101 is the data to be read in the read operation, the data stored in the second latch 310 is mistakenly read for the read operation.

This error also occurs if there is a charge sharing between the GIO line loading a logic 'HIGH' data and the second latch 310 holding a logic 'LOW' data.

That is, if data to be read and data stored in the second latch 310 are in different logic levels, such an error occurs.

Moreover, the error can be more serious in case that the GIO line is shared for both of the read operation and the write operation. An example for this error is described below.

It is assumed that the conventional semiconductor memory device reads a logic 'HIGH' data at $(N-1)^{th}$ clock, writes a logic 'HIGH' data at $N^{th}$ clock and reads a logic 'LOW' data at $(N+1)^{th}$ clock.

Since the logic 'HIGH' data is read at $(N-1)^{th}$ clock, the data stored in the second latch 310 is in a logic 'HIGH' level. Because the logic 'HIGH' data is written at $N^{th}$ clock, the signal loaded on the GIO line is also in a logic 'HIGH' level.

Thereafter, if the logic 'LOW' data is written at $(N+1)^{th}$ clock, there occurs an error because of the charge sharing as described above.

SUMMARY OF INVENTION

It is, therefore, an object of the present invention is to provide a semiconductor memory device with modified global input/output scheme.

In accordance with an aspect of the present invention, there is provided a semiconductor memory device including a main amplifier for amplifying an output from a bit line sensing amplifier and outputting the amplified output to a first data line; an input/output multiplexer connected to the first data line; a repeater connected to the first data line; an input/output write unit for receiving a data to be written and outputting the data to a second data line; and a write driver connected to the second data line for transferring the data on the second data line to the bit line sensing amplifier.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a read/write control device for a semiconductor memory device in accordance with the present invention will be described in detail referring to the accompanying drawings.

Figure 1:
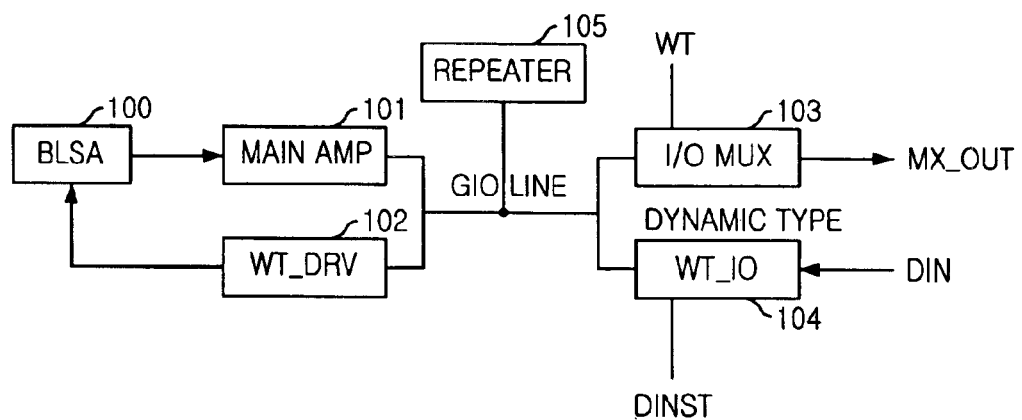
FIG. 1 is a block diagram showing a read/write control circuit of a conventional semiconductor memory device.
Figure 2:
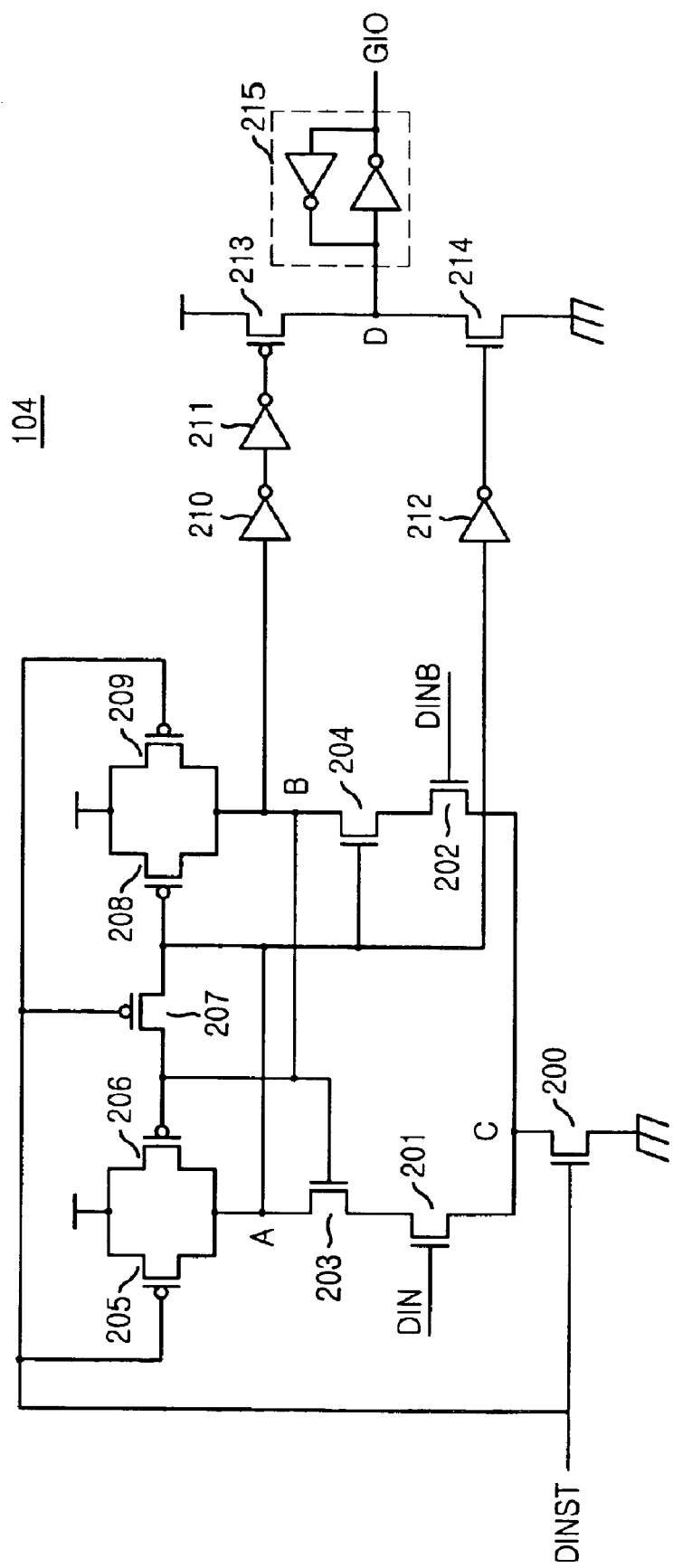
FIG. 2 is a circuit diagram showing an input-output write unit shown in FIG. 1.
Figure 3:
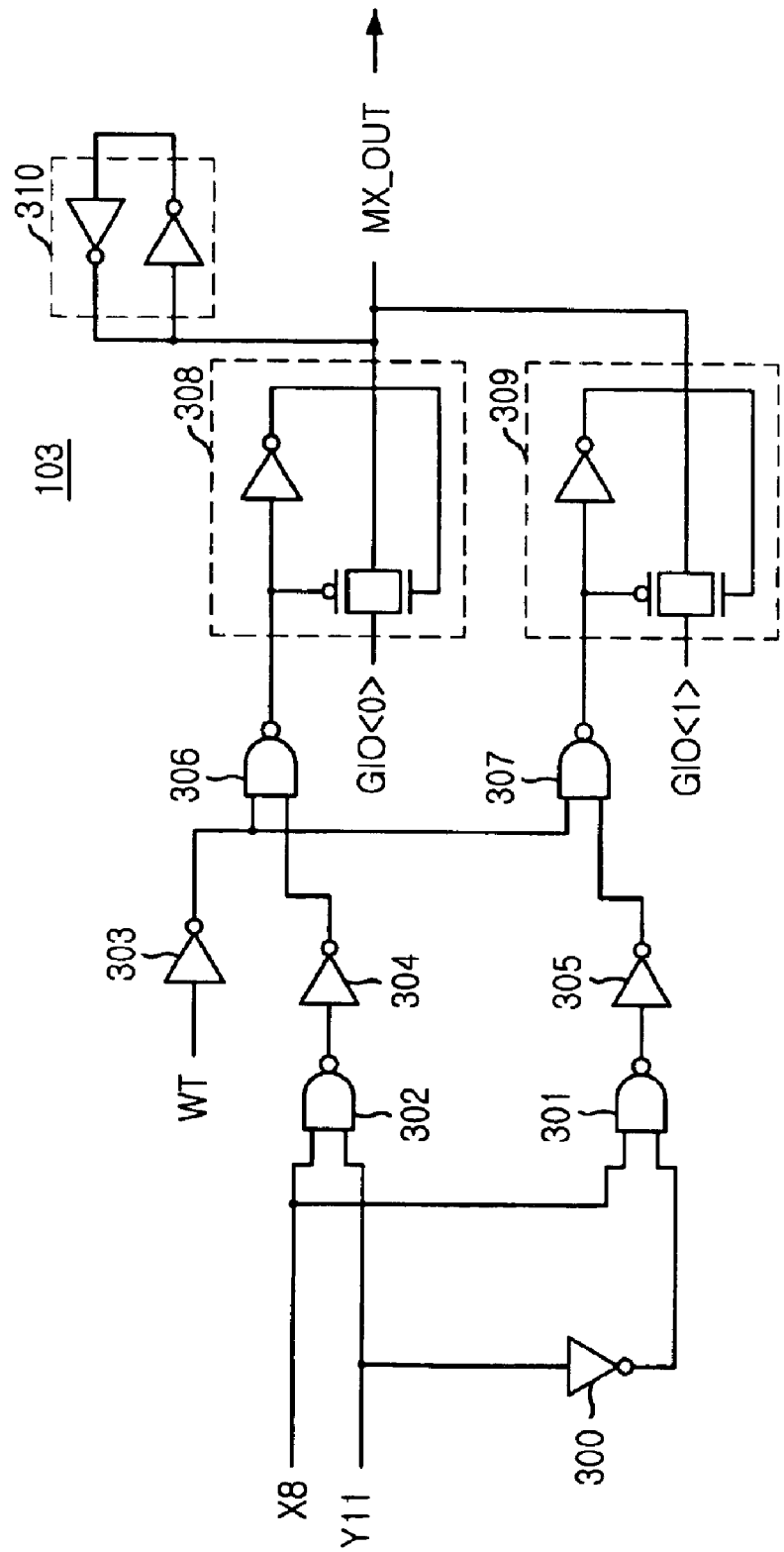
FIG. 3 is a circuit diagram showing an input-output multiplexer shown in FIG. 1.
Figure 4:
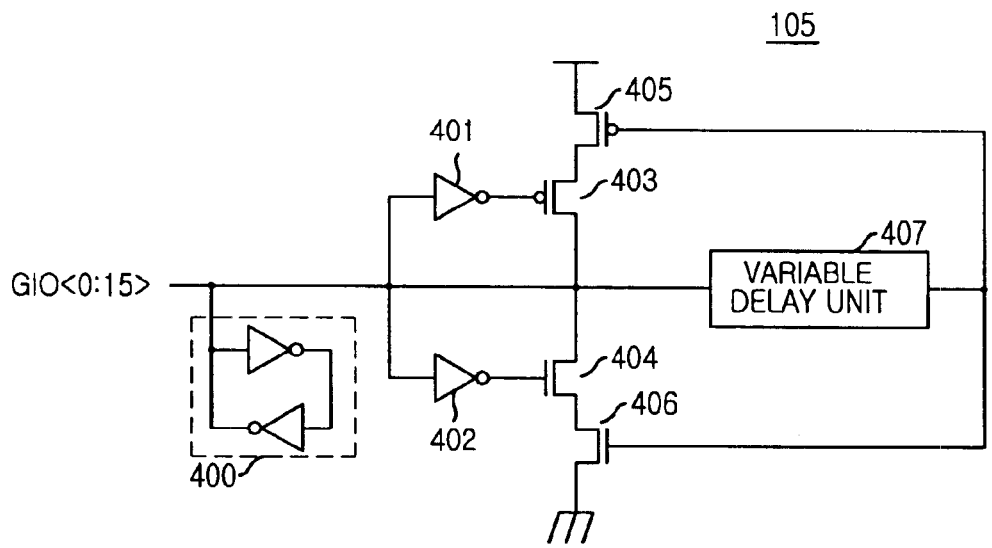
FIG. 4 is a circuit diagram showing a repeater included in the conventional semiconductor memory device.
Figure 5:
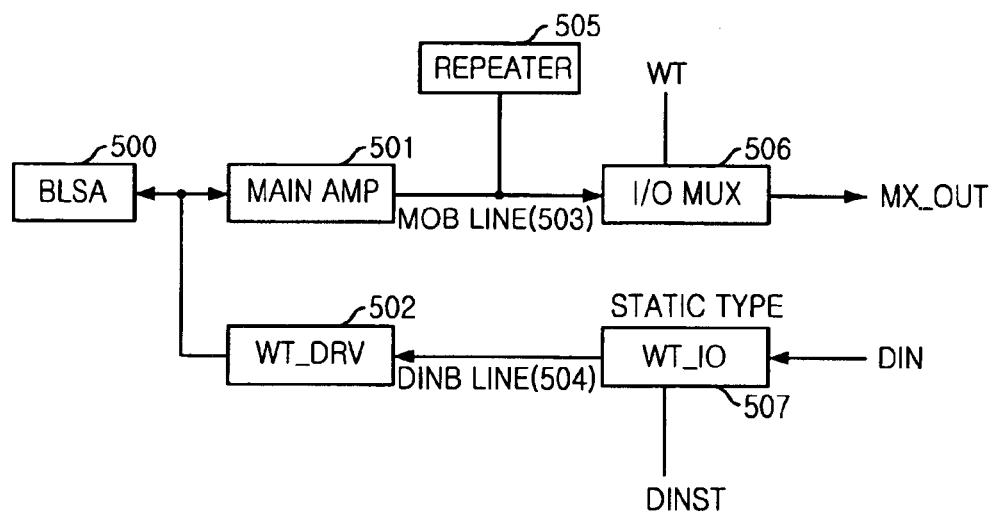
FIG. 5 is a block diagram showing a read/write control device in accordance with the present invention.

FIG. 5 is a block diagram showing the read/write control device in accordance with the present invention.

As shown, the read/write control device includes a bit line sensing amplifier BLSA 500, a main amplifier MAIN AMP 501, a write driver WT_DRV 502, a repeater 505, an input-output multiplexer I/O MUX 506, an input-output write unit WT_IO 507, a main amplifier output bar (MOB) line 503 and a data input bar (DINB) line 504.

The bit line sensing amplifier BLSA 500 is for amplifying a data stored in a memory cell. The main amplifier MAIN AMP 501 amplifies an outputted signal from the bit line sensing amplifier BLSA 500 and outputs the amplified signal to the MOB line 503. The input-output multiplexer I/O MUX 506 selectively outputs a signal on the MOB line 503. The input-output write unit WT_IO 507 receives a data to be written and outputs the data to the DINB line 504. The write drive WT_DRV 502 receives a signal from the DINB line 504 to output the signal to the bit line sensing amplifier BLSA 500. The repeater 505 is connected to the MOB line 503.

In accordance with the present invention, a data stored in a memory cell is outputted through the MOB line 503 in the read operation, and a data is stored into the memory cell through the DINB line 504 in the write operation.

In the read operation, the data stored in the memory cell is outputted by the bit line sensing amplifier BLSA 500 to the main amplifier MAIN AMP 501, and the data is loaded on the MOB line 503 by the main amplifier MAIN AMP 501.

Then, the data loaded on the MOB line 503 is inputted to the input-output multiplexer I/O MUX 506 and outputted selectively by the input-output multiplexer I/O MUX 506. The input-output multiplexer I/O MUX 506 is for selecting a data mode from x4, x8, and x16 depending on a data-width and also for a parallel test mode.

In the write operation, a data input (DIN) signal is inputted to the input-output write unit WT_IO 507 and the DIN is loaded on the DINB line 504 by the input-output write unit WT_IO 507. Then, the DIN is inputted to the write driver WT_DRV 502 to be outputted to the bit line sensing amplifier BLSA 500. The DIN is stored into the memory cell by the bit line sensing amplifier BLSA 500.

As described above, in the semiconductor memory device in accordance with the present invention, a conventional GIO line is modified by dividing the GIO line into the two lines; they are the MOB line 503 for the read operation and the DINB line 504 for the write operation. The input-output multiplexer I/O MUX is also modified to correct an error occurred in the conventional semiconductor memory device.

Figure 6:
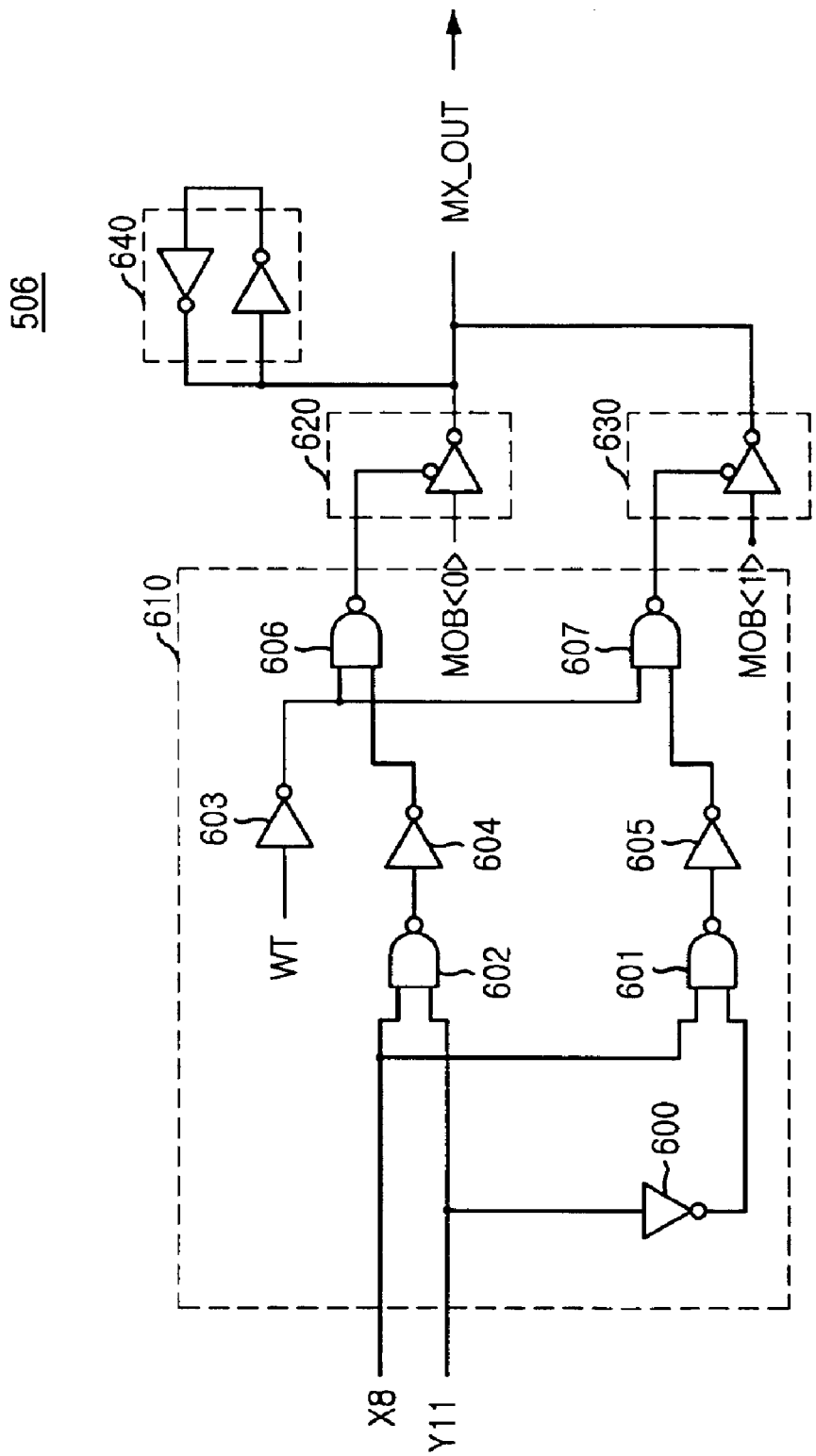
FIG. 6 is a schematic circuit diagram showing an input-output multiplexer shown in FIG. 5.

FIG. 6 is a schematic circuit diagram showing the input-output multiplexer I/O MUX 506.

As shown, the input-output multiplexer I/O MUX 506 includes a control unit 610, a latch 640, a first clocked inverter 620 and a second clocked inverter 630.

The input-output multiplexer I/O MXU 506 adopts the first clocked inverter 620 and the second clocked inverter 630 instead of two transferring gates used in the conventional semiconductor memory device. Therefore, a charge sharing between the MOB line 503 and a latch 640 is basically cut off.

The control unit 610 receives a data-width signal X8, an address signal Y11 and a write signal WT to generate control signals for controlling the first and second clocked inverters 620 and 630. The first and second clocked inverters 620 and 630 receive a first data signal MOB<0> and a second data signal MOB<1> respectively. The latch 640 is connected to the multiplexer output terminal MX_OUT. The multiplexer output terminal MX_OUT is also connected to output terminals of the first and second clocked inverters 620 and 630.

The control unit 620 is provided with a first inverter 600, a second inverter 603, a third inverter 604, a fourth inverter 605, a first NAND gate 601, a second NAND gate 602, a third NAND gate 604 and a fourth NAND gate 605.

The first inverter 600 receives an address signal Y11 and inverts the Y11 to output the inverted signal to the first NAND gate 601. The first NAND gate 601 receives the data-width signal X8 and an output from the first inverter 600.

The second NAND gate 602 receives the data-width signal X8 and the address signal Y11. The third inverter 604 inverts an output from the second NAND gate 602. The fourth inverter 605 inverts an output from the first NAND gate 601.

The second inverter 603 inverts the write signal WT. The third NAND gate 606 receives an output from the second inverter 603 and an output from the third inverter 604. The fourth NAND gate 607 receives the output from the second inverter 603 and an output from the fourth inverter 605.

The first and second clocked inverters 620 and 630 receive the first and second data signals MOB<0> and MOB<1> to invert and output the MOB<0> and MOB<1>, respectively.

The input-output multiplexer I/O MUX 506 is for the x8 mode, whereby a partial data division of a total data loaded on the GIO line is outputted through the multiplexer output terminal MX_OUT.

That is, only eight data signals from a total data signal MOB<0:15> are selected to be outputted through the multiplexer output terminal MX_OUT, wherein the notation 'MOB<0:15>' means MOB<0>, MOB<1>, . . . , and MOB<15>. Each of the eight data signals is selected from a first data signal pair MOB<0:1>, a second data signal pair MOB<2:3>, . . . , an eighth data signal pair MOB<14:15>. The address signal Y11 is used to select one data signal from each of the first to eighth data signal pairs, e.g., to select one data signal from the first data signal pair MOB<0:1>.

The write signal WT is activated as a logic 'HIGH' level in the write operation, and it is inactivated as a logic 'LOW' level in the read operation. The data-width signal X8 is activated as a logic 'HIGH' level in the x8 mode, and it is inactivated as a logic 'LOW' level if the input-output multiplexer I/O MUX 103 is not in the x8 mode.

As described above, the input-output multiplexer I/O MUX 506 outputs one of the first data signal pair MOB<0:1> in response to the address signal Y11 in the read operation. That is, if the address signal Y11 is in a logic 'HIGH' level, MOB<0> is selected; however, if the address signal Y11 is in a logic 'LOW' level, MOB<1> is selected. This selection is the same for the other data signal pairs, i.e., MOB<2:3>, MOB<4:5>, . . . , and MOB<14:15>.

If the write signal WT is activated, the input-output multiplexer I/O MUX 506 is disabled as described above because the input-output multiplexer I/O MUX 506 is operated in the read operation. That is, as the write signal WT is activated, outputs from the third and fourth NAND gates 606 and 607 are in a logic 'HIGH' level, whereby the first and second clocked inverters 620 and 630 are disabled, and the multiplexer output terminal MX_OUT holds the data stored in the latch 640.

Likewise, if the input-output multiplexer I/O MUX 506 is not in the x8 mode, the data-width signal X8 is inactivated as a logic 'LOW' level, whereby outputs from the first and second NAND gates 601 and 602 become in a logic 'HIGH' level. Subsequently, the first and second clocked inverters 620 and 630 are disabled, and the multiplexer output terminal MX_OUT holds the data stored in the latch 640.

As shown in FIG. 6, even though the two clocked inverters 620 and 630 are operated during the read operation, there is no charge sharing between the MOB line 503 and the latch 506 because of the structure of the two clocked inverters 620 and 630. This structure is described below.

Figure 7A:
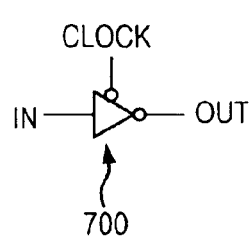
FIGS. 7A and 7B show a symbol of a clocked inverter and a circuit diagram of the clocked inverter used in the semiconductor memory device in accordance with the present invention.
Figure 7B:
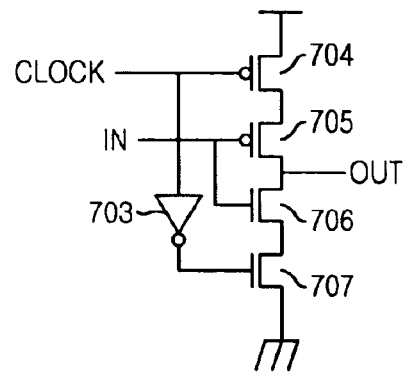

FIGS. 7A and 7B show a symbolic diagram and a circuit diagram showing one of the first and second clocked inverters 620 and 630. The first and second clocked inverters 620 and 630 have the same structure.

FIG. 7A shows the symbolic diagram for the clocked inverter. The symbolic diagram is figured in detail in FIG. 7B.

As shown in FIG. 7B, the clocked inverter includes a fifth inverter 703, a first PMOS transistor 704, a second PMOS transistor 705, a first NMOS transistor 706 and a second NMOS transistor 707. The four transistors are connected serially between a power supply voltage and a ground. A clock signal CLOCK is inputted to a gate of the first PMOS transistor 704 and an inverted signal of the clock signal CLOCK is inputted to the gate of the second NMOS transistor 707. An input signal IN is inputted to gates of the second PMOS transistor 705 and the first NMOS transistor 706.

If the clock signal CLOCK is in a logic 'LOW' level, the first PMOS transistor 704 and the second NMOS transistor 707 are turned-on and operated as an inverter. On the other hand, if the clock signal CLOCK is in a logic 'HIGH' level, the first PMOS transistor 704 and the second NMOS transistor 707 are turned-off, whereby the clocked inverter is disabled.

The clock signal CLOCK is matched to an output from the third NAND gate 606 and an output from the fourth NAND gate 607. The input signal IN is matched to the first and second data signals MOB<0> and MOB<1>. Since the first data signal MOB<0> is inputted to the gates of the second PMOS transistor 705 and the first NMOS transistor 706, there is no charge sharing between the latch 640 and the MOB line 503. This is the same for the second data signal MOB<1>.

Figure 8:
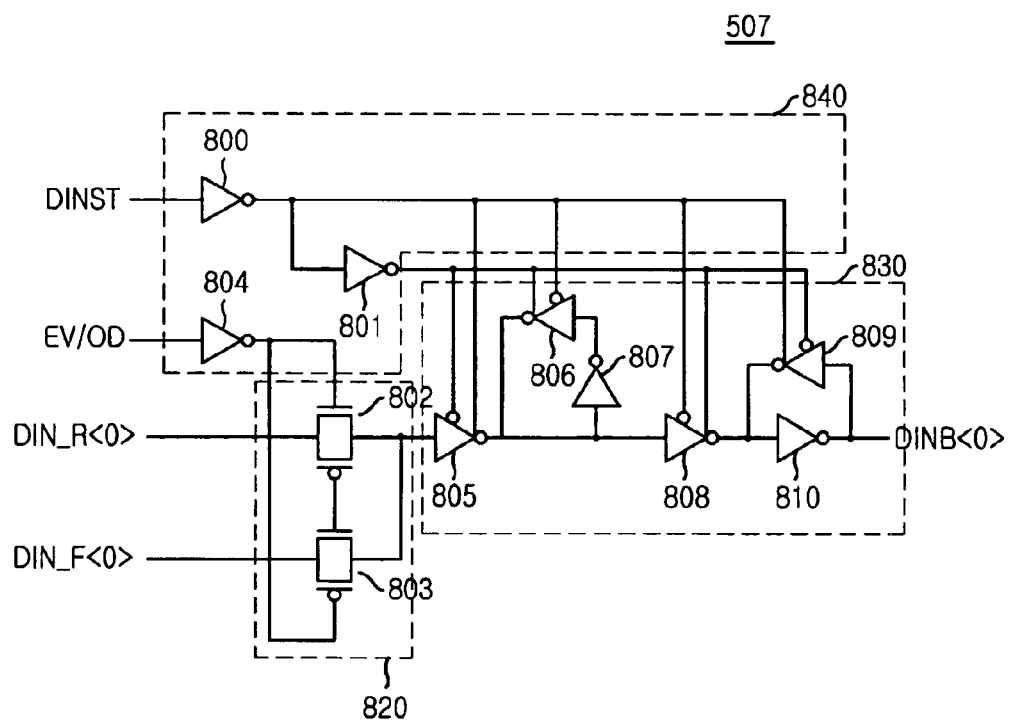
FIG. 8 is a circuit diagram showing an input-output write unit shown in FIG. 5.

FIG. 8 is a circuit diagram showing the input-output write unit WT_IO 507.

As shown, the input-output write unit WT_IO 507 includes a transferring gate unit 820, an operating unit 830 and a control unit 840.

The transferring gate unit 820 receives a data input rising signal DIN_R<0> and a data input falling signal DIN<0> and outputs one of the received signals in response to a selection signal EV_OD. The operating unit 830 transfers an output from the transferring gate unit 820 to the DINB line 504. The control unit 840 controls the operating unit 830.

The transferring gate unit 820 is provided with a third transferring gate 802 and a fourth transferring gate 803. The third transferring gate 802 receives the data input rising signal DIN_R<0>. The fourth transferring gate 803 receives the data input falling signal DIN_F<0>.

The control unit 840 is provided with a sixth inverter 800, a seventh inverter 801 and an eighth inverter 804. The first inverter 800 receives a data input strobe signal DINST and inverts the received signal. The seventh inverter 801 receives an output from the sixth inverter 800. The eighth inverter 804 receives the selecting signal EV_OD to invert the selecting signal EV_OD.

The operating unit 830 is provided with a third clocked inverter 805, a fourth clocked inverter 806, a fifth clocked inverter 808, a sixth clocked inverter 809, a ninth inverter 807 and a tenth inverter 810.

The third clocked inverter 805 receives an output from the transferring gate unit 820. The fourth clocked inverter 806 and the ninth inverter 807 are for latching an output from the third clocked inverter 805. The fifth clocked inverter 808 receives an output from the third clocked inverter 805. The sixth clocked inverter 809 and the tenth inverter 810 are for latching an output from the fifth clocked inverter 808.

The data input rising signal DIN_R<0> or the data input falling signal DIN_F<0> is loaded on the DINB line 504 synchronizing with the data input signal DINST.

The data input rising signal DIN_R<0> is synchronized with a rising edge of the data input strobe signal DINST, and the data input falling signal DIN_F<0> is synchronized with a falling edge of the data input strobe signal DINST.

If the selection signal EV_OD is in a logic 'HIGH' level, the data input falling signal DIN_F<0> is inputted to the third clocked inverter 805. On the other hand, If the selection signal EV_OD is in a logic 'LOW' level, the data input rising signal DIN_R<0> is inputted to the third clocked inverter 805.

The operation of the input-output write unit WT_IO 507 is described below assuming that the selection signal EV_OD is in a logic 'HIGH' level and the data input strobe signal DINST is activated changing from a logic 'LOW' level to a logic 'HIGH' level.

If the data strobe signal DINST is in a logic 'LOW' level, the third and sixth clocked inverters 805 and 809 are enabled, while the fourth and fifth clocked inverters 806 and 808 are disabled. If the data strobe signal DINST becomes in a logic 'HIGH' signal, the third and sixth clocked inverters 805 and 809 are disabled, while the fourth and fifth clocked inverters 806 and 808 are enabled.

The input-output write unit WT_IO latches a data when the data input strobe signal DINST is in a logic 'LOW' level, and outputs the data to the DINB line when the data input strobe signal DINST becomes in a logic 'HIGH' level.

That is, in case that the selection signal EV_OD is in a logic 'HIGH' level and the data strobe signal DINST is in a logic 'LOW' level, the third clocked inverter 805 is enabled, whereby the inverted DIN_F<0> is outputted by the third clocked inverter 805.

However, since the fifth clocked inverter 808 is disabled, the inverted DIN_F<0> outputted from the third clocked inverter 805 has no effect on an output from the fifth clocked inverter 808.

In addition, when the data strobe signal DINST is in a logic 'LOW' level, the sixth clocked inverter 809 is turned-on, and the sixth clocked inverter 809 holds a current value of the DINB<0>.

Thereafter, if the data input strobe signal DINST is activated, the fourth and fifth clocked inverters 806 and 808 are enabled, while the third and sixth clocked inverters 805 and 809 are disabled.

Therefore, since the fifth clocked inverter 808 is enabled, whereby the inverted DIN_F<0> is inputted to the fifth clocked inverter 808. Then the fifth clocked inverter 808 outputs the data input falling signal DIN_F<0>.

Likewise, since the fourth clocked inverter 806 is enabled, the fourth clocked inverter 806 and the ninth inverter 807 operate the fifth clocked inverter 808, whereby the inverted DIN_F<0> is loaded on the DINB<0> by the tenth inverter 810.

Thereafter, if the data input strobe signal DINST is activated, the sixth clocked inverter 809 is enabled, whereby the sixth clocked inverter 809 and the tenth inverter 810 hold a data loaded on the DINB<0>.

Hereinafter, the read operation and the write operation of the semiconductor memory device in accordance with the present invention are described referring FIGS. 5 to 8.

If the semiconductor memory device reads a logic 'HIGH' data stored in a memory cell at (N−1)$^{th}$ clock, the logic 'HIGH' data stored in the memory cell is outputted through the bit line sensing amplifier BLSA 500, the main amplifier MAIN AMP 501, the MOB line 503 and the input-output multiplexer I/O MUX 506. Herein, the 'N' expresses a natural number greater than one.

Since the semiconductor memory device is in the read operation, one of the first data signal MOB<0> and the second data signal MOB<1> is outputted to the input-output multiplexer I/O MUX 506. Then, the latch 640 holds the logic 'HIGH' data.

In the read operation, although one of the first clocked inverter 620 and the second clocked inverter 630 is enabled, there is no charge sharing between the MOB line 503 and the latch 640 because the MOB line 503 is connected to the gates of a PMOS transistor and an NMOS transistor.

Thereafter, if the conventional semiconductor memory device writes a logic 'LOW' data on the memory cell at N$^{th}$ clock, the logic 'LOW' data is passed through the input-output write unit WT_IO 507, the DINB line 504, the writ drive WT_DRV 502 and the bit line sensing amplifier BLSA 500 to be stored on the memory cell.

Since the conventional semiconductor memory device is in the write operation, the write signal WT is activated, whereby outputs from the third and fourth NAND gates 606 and 607 are in a logic 'HIGH' level. Subsequently, the data stored in the latch 640 is not changed, i.e., the latch 640 still holds the data stored at the (N−1)$^{th}$ clock because the first clocked inverter 620 and the second clocked inverter 630 are disabled.

Thereafter, if the semiconductor memory device reads a logic 'LOW' data stored in the memory cell at the (N+1)$^{th}$ clock, the logic 'LOW' data stored in the memory cell is passed through the bit line sensing amplifier BLSA 500, the main amplifier MAIN AMP 501, the MOB line 503 and the input-output multiplexer I/O MUX 506 to be outputted.

Since the semiconductor memory device is in the read operation, one of the first and second clocked inverters 620 and 630 is enabled, whereby the logic 'LOW' data loaded on the MOB line 503 is outputted through the multiplexer output terminal MX_OUT. At this time, the latch 640 holds the logic 'LOW' data instead of the logic 'HIGH' data at the N$^{th}$ clock.

As described above, since there is no charge sharing between the latch 640 and the MOB line 503, there occurs no error even though the repeater 505 is connected to the MOB line 503.

Because the GIO line is commonly used for the read operation and the write operation in the conventional semiconductor memory device, there occurs lots of a coupling noise. That is, since the GIO line is shared for the read operation and the write operation in the conventional semiconductor memory device, if data to be read and data to be written are in different logic levels, erroneous data can be read or written.

In accordance with the present invention, there are provided the MOB line 503 for the read operation and the DINB line 504 for the write operation. Therefore, the coupling noise can be reduced in the semiconductor memory device in accordance with the present invention. Moreover, a coupling noise immunity of the repeater can be increased in the semiconductor memory device in accordance with the present invention because the repeater is sensitive to a noise.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a main amplifier for amplifying an output from a bit line sensing amplifier and outputting the amplified output to a first data line;
   an input/output multiplexer connected to the first data line;
   a repeater connected to the first data line;
   an input/output write unit for receiving a data to be written and outputting the data to a second data line; and
   a write driver connected to the second data line for transferring the data on the second data line to the bit line sensing amplifier.

2. The semiconductor memory device as recited in claim 1, wherein the input/output multiplexer includes:
- a clocked inverter for receiving an output from the first data line; and
- a latch connected to an output terminal of the clocked inverter, wherein there is no charge sharing between the latch and the first data line.

3. The semiconductor memory device as recited in claim 2, wherein the input/output multiplexer includes:
- a control unit for receiving an address signal, a mode signal and a write signal to control the clocked inverter;
- a clocked inverter for receiving an output from the first data line; and
- a latch connected to an output terminal of the clocked inverter, wherein the write signal is activated in a write operation.

4. The semiconductor memory device as recited in claim 3, wherein the control unit includes:
- a first inverter for receiving an address signal to invert the address signal;
- a first NAND gate for receiving a mode signal and an output from the first inverter;
- a second NAND gate for receiving the mode signal and the address signal;
- a second inverter for receiving the write signal to invert the write signal;
- a third inverter for inverting an output from the second inverter;
- a fourth inverter for inverting an output from the first NAND gate;
- a third NAND gate for receiving an output from the second inverter and an output from the third inverter; and
- a fourth NAND gate for receiving an output from the second inverter and an output from the fourth inverter.

5. The semiconductor memory device as recited in claim 1, wherein the input/output write unit includes:
- a transferring gate for receiving a data and selectively outputs the data;
- an operating unit for transferring an output from the transferring gate to a second data line; and
- a control unit for generating a control signal to control the transferring gate and the operating unit, wherein the input/output write unit is a static type having a clocked inverter.

6. The semiconductor memory device as recited in claim 5, wherein the control unit includes:
- a tenth inverter for receiving and inverting a data input strobe signal;
- a eleventh inverter for inverting an output from the tenth inverter; and
- a twelfth inverter for receiving and inverting an even-odd signal.

7. The semiconductor memory device as recited in claim 6, wherein the control unit includes:
- a first clocked inverter for receiving an output from the transferring gate to invert the output from the transferring gate;
- a second clocked inverter and a thirteenth inverter for latching an output from the first clocked inverter;
- a third clocked inverter for receiving an output from the first clocked inverter to invert the output from the first clocked inverter; and
- a fourth clocked inverter and a fourteenth inverter for latching an output from the third clocked inverter.

8. The semiconductor memory device as recited in claim 1, further comprising a repeater connected to the second data line.

9. The semiconductor memory device as recited in claim 1, wherein one of the first data line and the second data line is selected depending on a write operation or a read operation.

* * * * *